United States Patent [19]

Lu et al.

[11] Patent Number: 5,196,367
[45] Date of Patent: Mar. 23, 1993

[54] MODIFIED FIELD ISOLATION PROCESS WITH NO CHANNEL-STOP IMPLANT ENCROACHMENT

[75] Inventors: Chih-Yuan Lu, Taipei; Hsiao-Chin Tuan, Hsin-Tien, both of Taiwan

[73] Assignee: Industrial Technology Research Institute, Hsinchu, Taiwan

[21] Appl. No.: 697,190

[22] Filed: May 8, 1991

[51] Int. Cl.$^5$ .................................. H01L 21/76
[52] U.S. Cl. .......................... 437/70; 148/DIG. 117; 437/69; 437/968
[58] Field of Search ............... 437/70, 69, 968; 148/DIG. 117

[56] References Cited

U.S. PATENT DOCUMENTS

| | | | |
|---|---|---|---|
| 4,376,336 | 3/1983 | Endo et al. | 437/46 |
| 4,829,019 | 5/1989 | Mitchell et al. | 437/70 |
| 4,897,364 | 1/1990 | Nguyen et al. | 437/70 |

FOREIGN PATENT DOCUMENTS

| | | | |
|---|---|---|---|
| 0039551 | 3/1982 | Japan | 437/70 |
| 0013374 | 1/1984 | Japan | 437/70 |
| 0256650 | 11/1986 | Japan | 437/70 |
| 0260841 | 10/1989 | Japan | 437/70 |

Primary Examiner—Brian E. Hearn
Assistant Examiner—Trung Dang
Attorney, Agent, or Firm—George O. Saile

[57] ABSTRACT

A method for fabricating semiconductor devices having field oxide isolation with channel stop is described which overcomes the encroachment problems of the prior art. A semiconductor substrate is provided. A multilayer oxidation masking structure of a silicon oxide layer, a polycrystalline silicon layer and a silicon nitride layer is formed. The multilayer oxidation mask is patterned by removing the silicon nitride layer and a portion of the polycrystalline silicon layer in the areas designated to have field oxide isolation grown therein. A sidewall insulator structure is formed on the exposed sidewalls of the patterned oxidation mask. Impurities are implanted into the area designated to have field oxide isolation to form the channel stop. The sidewall insulator structure is removed. The field oxide insulator structure is grown by subjecting the structure to oxidation whereby the channel stop is confined under the field oxide isolation and not encroaching the planned device regions.

16 Claims, 2 Drawing Sheets

MODIFIED FIELD ISOLATION PROCESS WITH NO CHANNEL-STOP IMPLANT ENCROACHMENT

BACKGROUND OF THE INVENTION

(1) Field of the Invention

The invention relates to processes for the manufacture of semiconductor devices and more particularly to processes for forming field isolation structure having channel stops associated therewith.

(2) Description of the Prior Art

As the size of semiconductor devices decrease there have been increasing problems. In semiconductor devices, particularly MOS field effect transistor devices there has become a problem in controlling transistor characteristics as the feature size of these devices go below one micrometer. The reasons for this problem which is termed "narrow channel effect" are the Bird's Beak effect in the field oxide isolation and the channel stop implant dopant diffusion encroachment into the channel region which reduces the effective channel width. The channel stop implant diffusion encroachment is caused by its process of manufacture which includes opening the desired pattern of oxidation mask to the regions to have field oxide isolation to be formed, ion implantation of the channel stop impurity therethrough and then the oxidation to form the field oxide isolation. The channel stop implant will deeply diffuse into the semiconductor substrate as the oxidation of the silicon progresses. During this oxidation, the dopant will encroach into the MOS field effect transistor channel regions. This encroachment will then raise the threshold voltage of the narrow channel device and making device control more difficult.

Workers in the field have understood these problems and have attempted to overcome them.

Nguyen et al U.S. Pat. No. 4,897,364 describes a method for overcoming channel stop impurity encroachment. They use silicon nitride sidewall structures on the patterned sidewalls before the channel stop impurity implant. They do not remove these sidewall structures until after the field oxide isolation is completed. The result of this is the wider spacing between field oxide isolation regions in the device region. Thus wasting valuable space.

Mitchell et al U.S. Pat. No. 4,829,019 also describes a method for overcoming channel stop encroachment. Their method includes the use of sidewall structures on the patterned sidewalls of the oxidation mask before the channel stop ion implantation. They also remove the sidewall structures before field oxide isolation. The problem presented by their process is illustrated in the Prior Art FIGS. 1 through 3. FIG. 1 show the semiconductor substrate 10, a silicon oxide layer 12 thereon, and the silicon nitride layer 14 thereover. A silicon oxide sidewall layer 16 has be formed by conventional anisotropic etching. The Boron, B ions are shown by arrows to be implanted at 18 into the substrate 10. The sidewall structures 16 are removed as by dip chemical etching. The problem is shown in FIG. 2 wherein there is an undercut etch at 20 having a length $L_U$ of the silicon oxide layer 12. The result of this undercutting after the oxidation step is a longer Bird's Beak length, $L_{BB,U}$ than is desirable as can be seen in FIG. 3.

It is therefore an object of this invention to provide a process for fabricating field oxide isolation pattern with channel stops associated therewith that do not have the problems of Bird's Beak with extra length and channel stop encroachment of the prior art.

SUMMARY OF THE INVENTION

Accordingly, a method for fabricating semiconductor devices having field oxide isolation with channel stop is described which overcomes the encroachment problems of the prior art. A semiconductor substrate is provided. A multilayer oxidation masking structure of a silicon oxide layer, a polycrystalline silicon layer and a silicon nitride layer is formed. The multilayer oxidation mask is patterned by removing the silicon nitride layer and a portion of the polycrystalline silicon layer in the areas designated to have field oxide isolation grown therein. A sidewall insulator structure is formed on the exposed sidewalls of the patterned oxidation mask. Impurities are implanted into the area designated to have field oxide isolation to form the channel stop. The sidewall insulator structure is removed. The field oxide insulator structure is grown by subjecting the structure to oxidation whereby the channel stop is confined under the field oxide isolation and not encroaching the planed device regions.

Semiconductor devices such as high density VLSI MOS field effect transistor devices are formed into the regions of the structure not covered by the field oxide isolation. The remaining multilayer oxidation mask must first be removed by conventional etching techniques. Then the semiconducting devices are formed therein by conventional techniques.

DESCRIPTION OF THE PREFERRED EMBODIMENTS

Figure 1:
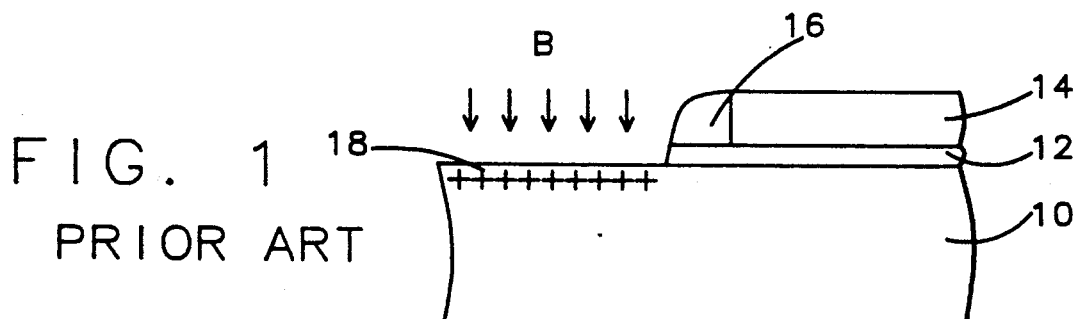
FIGS. 1 through 3 show a schematic cross sectional representation of a Prior Art and most conventional method for making a field oxide isolation structure and channel stop region.

Referring now to FIGS. 4 through 8 there is shown a first embodiment of the present invention. A P-doped (100) monocrystalline silicon substrate 30 is used. The multilayer oxidation mask is deposited onto the side of the substrate wherein the devices are to be formed. The multilayered oxidation mask is formed by first growing or depositing a thin silicon oxide layer 32 having a thickness between about 50 to 200 Angstroms. The layer is preferably formed by the conventional thermal growth process at a temperature of about 920° C. in an oxygen atmosphere. The polycrystalline silicon layer 34 has a thickness of between about 400 to 800 Angstroms and is deposited by low pressure chemical vapor deposition at temperatures between about 550° C. and 630° C. using silane as the silicon source. The final layer 36 is preferably silicon nitride having a thickness of between about 1200 to 2700 Angstroms and is deposited by low pressure chemical vapor deposition at a temperature of about 720° C. using dichlorosilane and ammonia as the source of the silicon and nitrogen. This completes the FIG. 4 structure.

Conventional lithography and anisotropic etching techniques are now used to pattern the multilayer oxidation mask. The anisotropic etching completely removes the silicon nitride layer 36, but only partially removes the polycrystalline silicon layer 34. This is a critical and very important step to leave a portion of the thickness of the layer 34. The thickness of the polycrystalline silicon layer 34 remaining must be more than about 200 Angstroms because it is critical to subsequently use this layer to prevent etching and undercutting into the layer 32. The remaining thickness should be less than about 400 Angstroms.

An insulating layer 38 is conformably formed over the silicon nitride layer 36, the sidewalls of the patterned multilayer mask and the polycrystalline silicon layer 32. The preferred material is silicon oxide and is preferably deposited by low pressure chemical vapor deposition using tetraethoxysilane decomposition at a temperature of about 750° C. Other insulating layer that can be used include spin-on-glass materials and organics, such a photoresists, polyimides and the like.

The thickness of this layer 38 will be the desired width of the sidewall structure to be formed by the next anisotropic etching process. The preferred anisotropic etching process for the conformal coating is to use the conventional fluorocarbon gases, the particular choice being dependent upon the composition of the layer 38 in a magnetically enhanced reactive ion etching apparatus. It is desirable to have high etching selectivity. The advantage of the choice of silicon oxide is the possibility of high sensitivities of 15 to 30 verses polycrystalline silicon.

Figure 5:
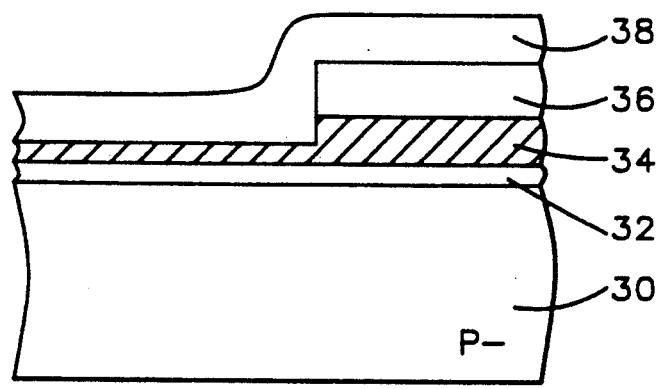
Figure 6:
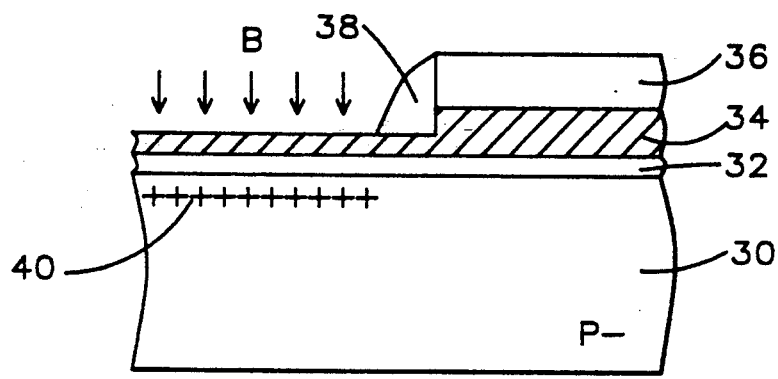

The thickness of the layer 38 is preferably between about 1000 to 2000 Angstroms. The purpose of the spacer width dimension is to give the resulting space between the channel stop and the self-aligned channel. FIG. 5 illustrates the conformal layer over the upper surfaces of the structure and FIG. 6 show the structure after the anisotropic etching of the conformal layer 38 which produces the sidewall structure 38.

An appropriate impurity 40 to create a P+ channel stop region 42 is implanted into the substrate 30 in the unmasked regions. Boron, B is an example of such an impurity and is implanted as shown by arrows at an energy of about 30 KeV and a density of between about $1 \times 10^{13}$ to $4 \times 10^{13}$ atoms/cm$^2$ in this embodiment. This results in the FIG. 6 structure.

The sidewall structure is now removed by a wet dip etching using typically hydrofluoric acid or buffered hydrofluoric acid. The polycrystalline silicon layer 34 prevents the etching of the layer 32 during the dip etching that removes the sidewall structure. Without this protection, where the sidewall spacer height is, for example 2500 Angstroms there would be an estimated undercutting of between 500 to 1000 Angstroms. This undercutting would cause an increase in the length of the Bird's Beak which is detrimental to submicron VLSI MOS field effect transistor devices.

The exposed polycrystalline silicon layer 34 can be allowed to remain and be oxidized during the field oxide isolation oxidation process. The thickness of this layer 34 would have little effect upon the field oxide isolation. Alternatively, the layer can be removed by conventional etching techniques.

The Field OXide isolation layer, FOX is now formed by the thermal growth process at a temperature of between about 900° to 1050° C. and preferably about 980° C. in an oxygen and steam atmosphere. The final structure of this process is shown in FIG. 7.

Figure 2:
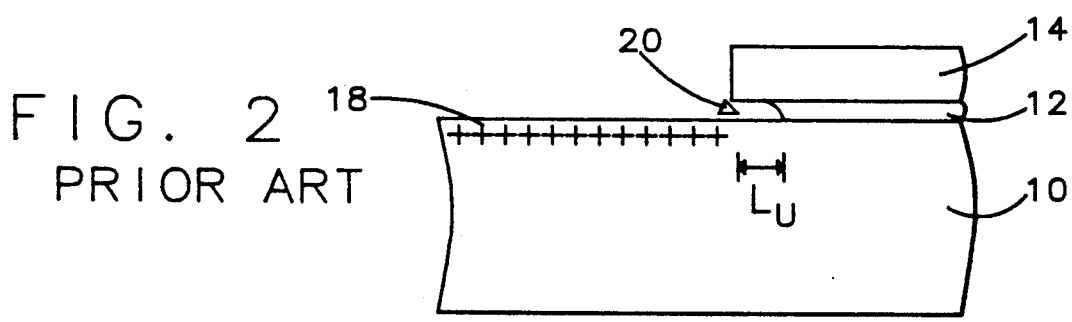
Figure 3:
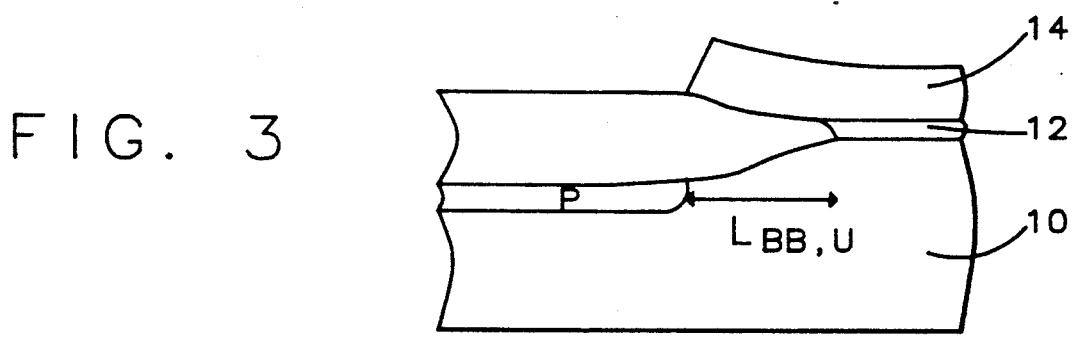
Figure 4:
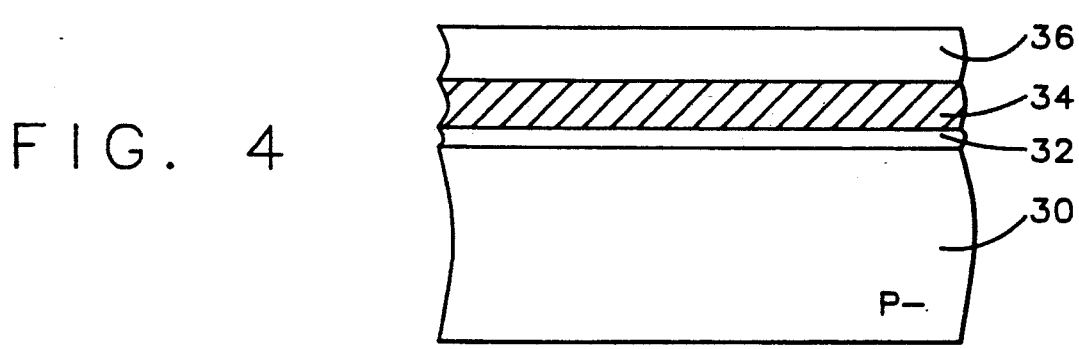
FIGS. 4 through 8 illustrate a schematic cross sectional representation of the process of the present invention for manufacturing a field oxide isolation structure and channel stop region.

The result of this process is to provide a shorter Bird's Beak length, $L_{BB,N}$ as compared to that of the conventional process Bird's Beak length, $L_{BB,U}$. The reason for this advantage is the FIGS. 4 through 8 process which overcomes the undercutting problem, $L_U$ of the conventional FIGS. 1 through 3 process.

Figure 7:
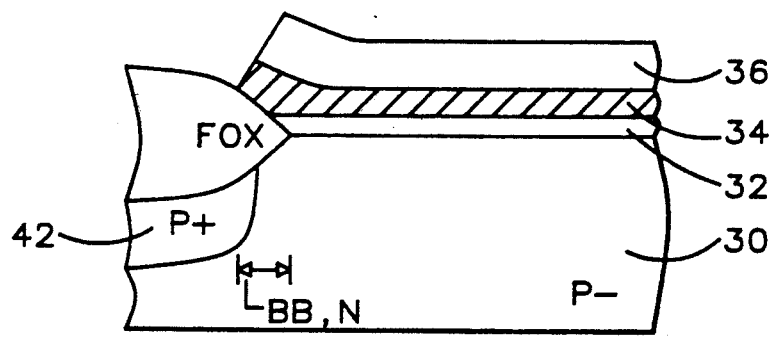

The multilayer oxidation mask that remains in the FIG. 7 is now removed by conventional etching processes for silicon nitride layer 36, polycrystalline layer 34 and silicon oxide layer 32.

Figure 8:
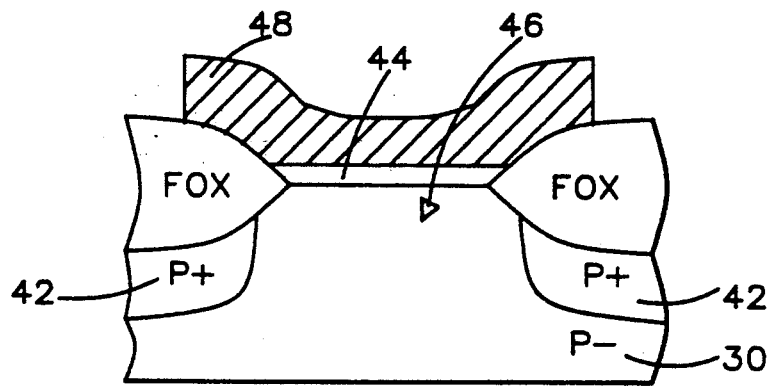

The narrow channel MOS field effect transistor devices, for example can now be formed in and over the silicon regions between the field oxide isolation pattern. Such a device is shown in FIG. 8 wherein a self-aligned channel 46 is formed between two field oxide isolation, FOX regions. A very thin gate silicon oxide layer 44 overlies the channel 46 and a conductive gate electrode 48 is positioned over the surface of the isolation, FOX and the gate silicon oxide layer 44. The source/drain regions as are understood by those skilled in the art are not shown, but are located adjacent to the gate region into and out of the paper.

The embodiment of FIGS. 4 through 8 used a P-substrate and a P+ channel stop region. It should be well understood be those skilled in the art that opposite conductivities may also be used. Further, it should be understood that CMOS field effect transistors are envisioned possibly requiring channel stops of either impurities of P or N under different field oxide isolation regions depending whether a P channel or N channel region is involved. Also, bipolar and BICMOS can also advantageously use this isolation process.

While the invention has been particularly shown and described with reference to the preferred embodiments thereof, it will be understood by those skilled in the art that various changes in form and details may be made without departing from the spirit and scope of the invention.

What is claimed is:

1. A method for fabricating semiconductor devices having field oxide isolation structures with a channel stop comprising:

providing a semiconductor substrate;

forming a multilayer oxidation masking structure of a silicon oxide layer, a polycrystalline silicon layer and a silicon nitride layer;

patterning said multilayer oxidation mask by removing the said silicon nitride layer and a portion of the thickness of said polycrystalline silicon layer in the areas designated to have said field oxide isolation grown therein;

wherein said polycrystalline silicon layer is between about 400 to 800 Angstroms in thickness and said patterning removes a portion of said layer to leave between about 200 to 400 Angstroms of said polycrystalline silicon layer;

forming a sidewall structure on the exposed sidewalls of the patterned oxidation mask by deposition of a uniformly thick, nonconductive layer over the patterned mask and anisotropically etching said uniformly thick layer, wherein the remaining thickness of said polycrystalline silicon is sufficient enough to prevent etching and undercutting into said silicon oxide layer during the formation of said sidewall structure and thin enough to not have a significant adverse effect on the subsequently formed said field oxide isolation structure;

implanting impurities into the said area designated to have said field oxide isolation to form said channel stop;

removing said sidewall structure; and growing said field oxide isolation structure by subjecting the structure to oxidation whereby the said channel stop is confined under the said field oxide isolation and not encroaching the planned device regions.

2. The method of claim 1 and further comprising removing the remaining said multilayer oxidation mask and forming said semiconductor devices therein.

3. The method of claim 1 wherein the said patterning is accomplished by reactive ion etching and the said sidewall structure is formed by a deposition of silicon dioxide followed by a reactive ion etching of said silicon dioxide to form a silicon oxide sidewall structure.

4. The method of claim 1 wherein the thickness of said silicon oxide layer in between about 50 to 200 Angstroms and the thickness of said silicon nitride layer is between about 1200 to 2700 Angstroms.

5. The method of claim 4 wherein the thickest portion of said sidewall structure is between about 1000 to 2000 Angstroms which guarantees the location of the said channel stop to be set back under the edges of said field oxide isolation.

6. The method of claim 1 wherein after the removal of said sidewall structure the said portion in thickness of polycrystalline silicon layer remaining is removed prior to said growing of said field oxide insulator structure.

7. The method of claim 1 wherein the said portion in thickness of polycrystalline silicon layer remaining is oxidized during said oxidation when said field oxide insulator structure is formed.

8. The method of claim 1 wherein the said substrate is P- and the said impurity used to form said channel stop is boron.

9. The method of claim 1 wherein the said patterning is accomplished by reactive ion etching and the said sidewall structure is formed by a deposition of an organic material followed by a reactive ion etching of said organic material to form an organic material sidewall structure.

10. A device isolation method for isolating field effect semiconductor devices having field oxide isolation structures with a channel stop comprising:

providing a semiconductor substrate;

forming a multilayer oxidation masking structure of a silicon oxide layer, a polycrystalline silicon layer and a silicon nitride layer;

patterning said multilayer oxidation mask by removing the said silicon nitride layer and a portion of said polycrystalline silicon layer in the areas designated to have said field oxide isolation grown therein;

wherein said polycrystalline silicon layer is between about 400 to 800 Angstroms in thickness and said patterning removes a portion of said layer to leave between about 200 to 400 Angstroms of said polycrystalline silicon layer;

forming a sidewall structure on the exposed sidewalls of the patterned oxidation mask by deposition of a uniformly thick, nonconductive layer over the patterned mask and anisotropically etching said uniformly thick layer, wherein the remaining thickness of said polycrystalline silicon is sufficient enough to prevent etching and undercutting into said silicon oxide layer during the formation of said sidewall structure and thin enough to not have a significant adverse effect on the subsequently formed said field oxide isolation structure;

implanting impurities into the said area designated to have said field oxide isolation to form said channel stop;

removing said sidewall structure;

growing said field oxide insulator structure by subjecting the structure to oxidation whereby the said channel stop is confined under the said field oxide isolation and not encroaching the planned device regions;

removing the remaining said multilayer oxidation mask; and forming field effect semiconductor devices between and on the semiconductor device regions within the said field oxide isolation.

11. The method of claim 10 wherein the said patterning is accomplished by reactive ion etching and the said sidewall structure is formed by a deposition of silicon oxide followed by a reactive ion etching of said silicon oxide to form a silicon oxide sidewall structure.

12. The method of claim 10 wherein the thickness of said silicon oxide layer in between about 50 to 200 Angstroms and the thickness of said silicon nitride layer is between about 1200 to 2700 Angstroms.

13. The method of claim 12 wherein the thickest portion of said sidewall structure is between about 1000 to 2000 Angstroms which guarantees the location of the said channel stop to be set back under the edges of said field oxide isolation.

14. The method of claim 10 wherein said field effect transistor devices have self-aligned channels.

15. The method of claim 10 wherein the said patterning is accomplished by reactive ion etching and the said sidewall structure is formed by a deposition of an organic material followed by a reactive ion etching of said organic material to form an organic material sidewall structure.

16. The method of claim 15 wherein the said organic material is a photoresist organic material.

* * * * *